United States Patent [19]

Szczesny et al.

[11] Patent Number: 5,667,391

[45] Date of Patent: Sep. 16, 1997

[54] ELECTRICAL CONNECTOR HAVING A TWO PART ARTICULATED HOUSING

[76] Inventors: David Stanley Szczesny, 117 N. Thistledown Dr.; William V. Pauza, 840 Stauffers Church Rd., both of Palmyra, Pa. 17078; James Ray Fetterolf, Sr., 302 Indian Creek Dr., Mechanicsburg, Pa. 17055

[21] Appl. No.: 429,372

[22] Filed: Apr. 26, 1995

[51] Int. Cl.$^6$ .................................................. H01R 9/09
[52] U.S. Cl. ........................ 439/79; 439/83; 439/590
[58] Field of Search .................................... 439/77, 78, 79, 439/83, 540.1, 571, 572, 590, 876

[56] References Cited

U.S. PATENT DOCUMENTS

| | | | |
|---|---|---|---|
| 4,975,067 | 12/1990 | Bastijanic et al. | 439/79 X |
| 5,282,751 | 2/1994 | Lwee | 439/78 X |
| 5,380,222 | 1/1995 | Kobayashi | 439/590 |
| 5,406,458 | 4/1995 | Schutt | 439/83 X |
| 5,461,774 | 10/1995 | Holmes et al. | 439/83 X |

FOREIGN PATENT DOCUMENTS

| | | | |
|---|---|---|---|
| 1252262 | 10/1967 | Germany | 439/590 |
| 4159792 | 6/1992 | Japan | 439/78 |
| WO95/10865 | 4/1995 | WIPO | |

OTHER PUBLICATIONS

New Electronics: No. 16, Aug. 17, 1984, London, GB; pp. 29–32, XP002005801; G.R. Latham: "Surface Mount with Flexible Circuits".

Primary Examiner—Jes F. Pascua

[57] ABSTRACT

An electrical connector (40) having a two part articulated housing (42) is disclosed. The connector, intended for surface mounting on a curved surface (74, 76) of a circuit board (56), includes two housing parts (44, 48) that are intercoupled by means of a flexible member (62) that permits relative movement of the two housing parts in a direction toward and away from the mounting surface but is substantially rigid in the lateral direction. The connector (40) is manufactured by stamping and forming a series of the flexible members (62) on a carrier strip (90), passing the carrier strip through a plastic injection mold machine (98) for molding the two housing parts (44, 48) insitu onto the flexible strip (62), and then passing the carrier strip (90) through a contact insertion machine (102) for inserting the contacts (46,50) into the two housing parts (44, 48).

7 Claims, 6 Drawing Sheets

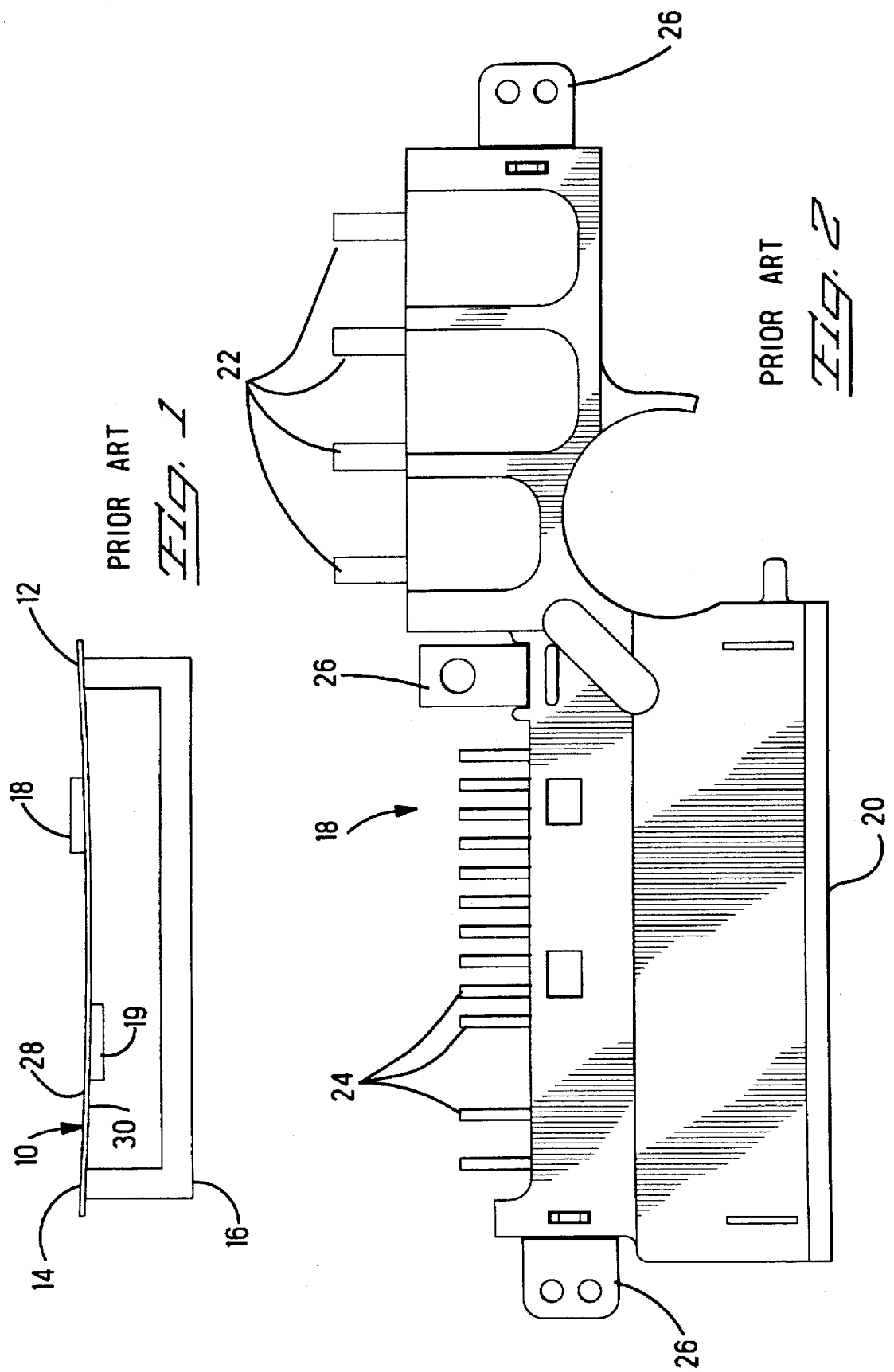

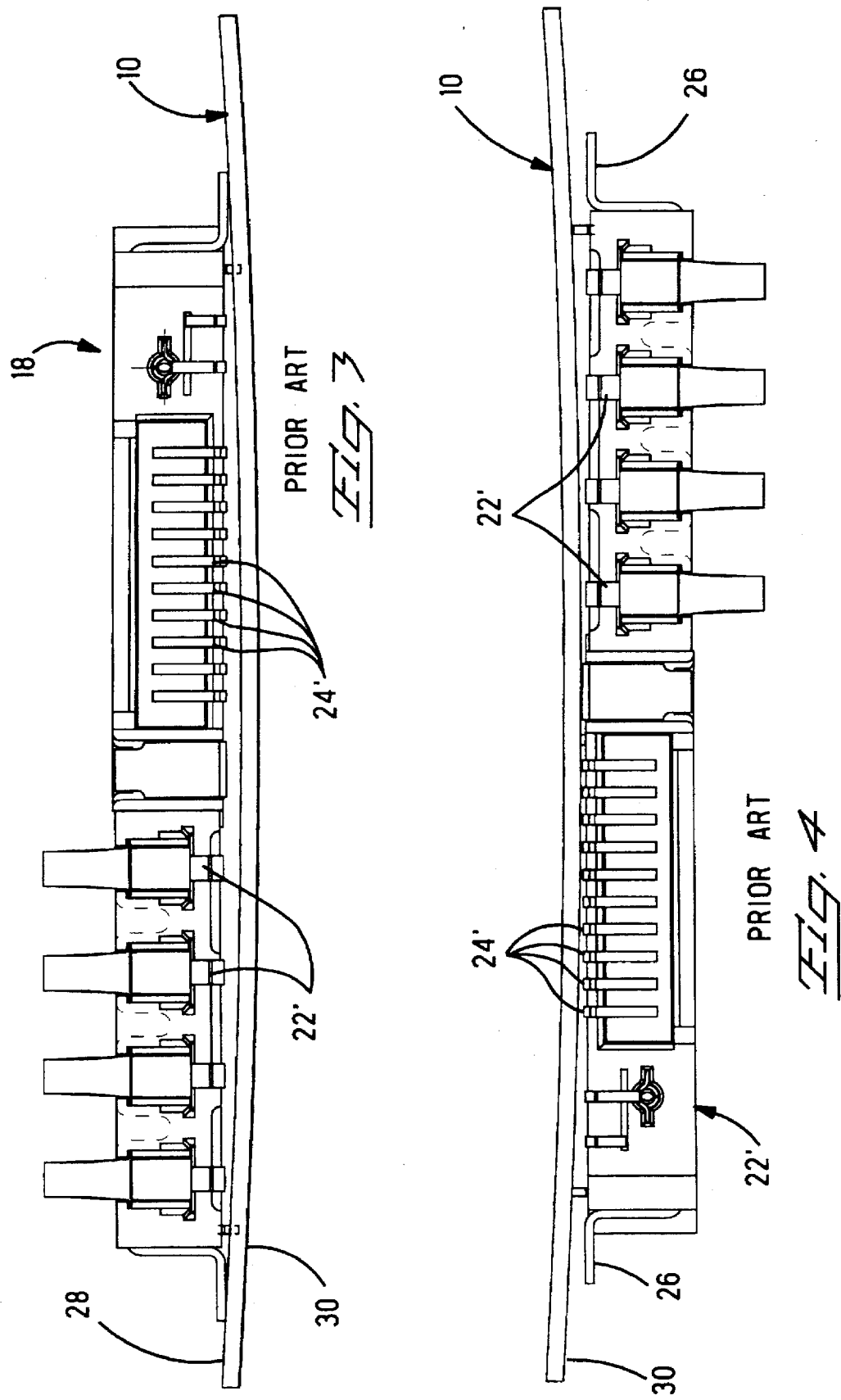

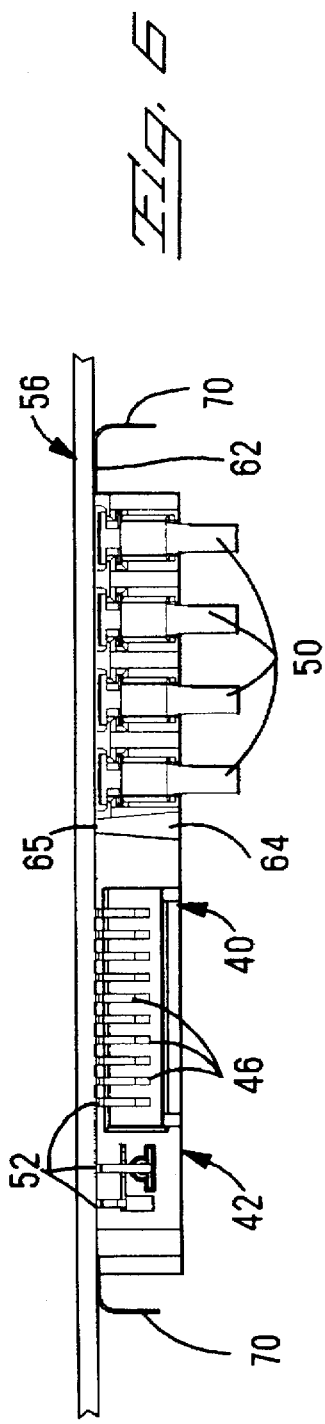
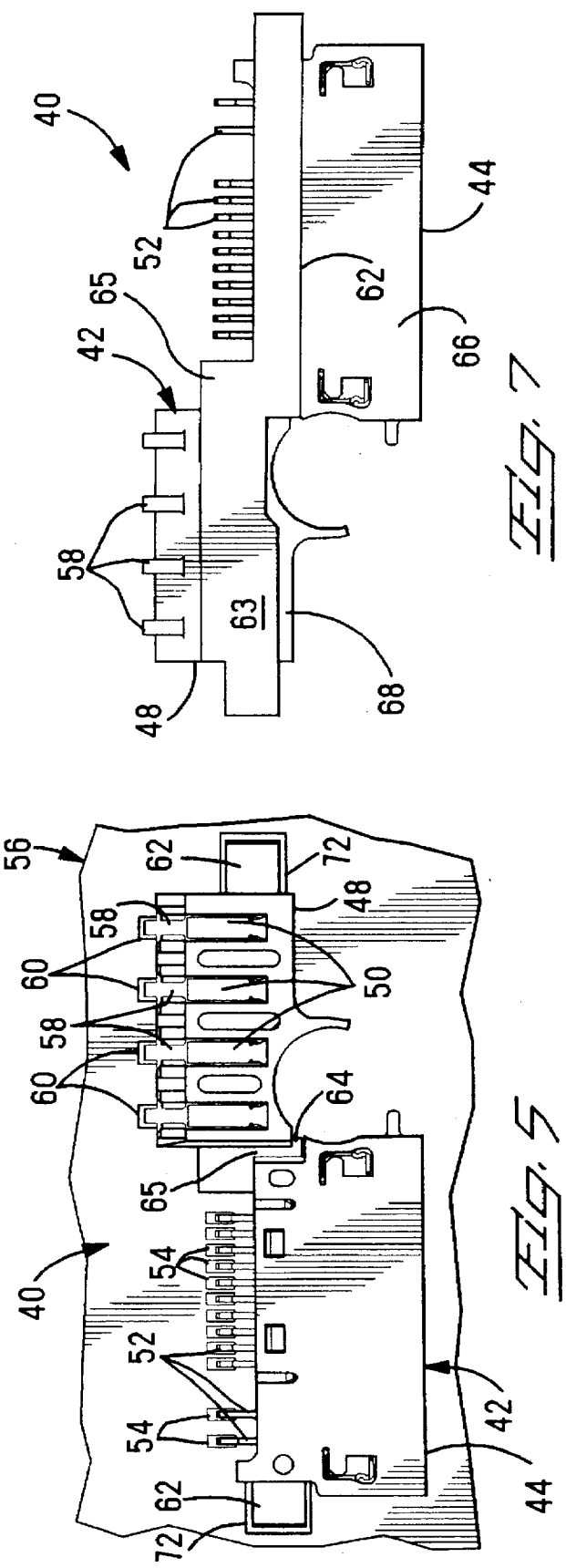

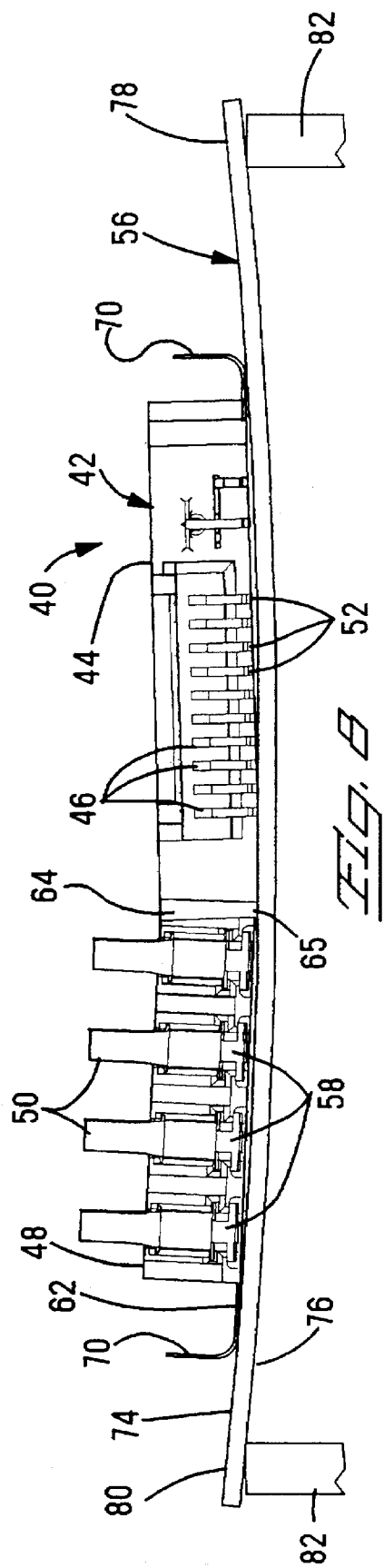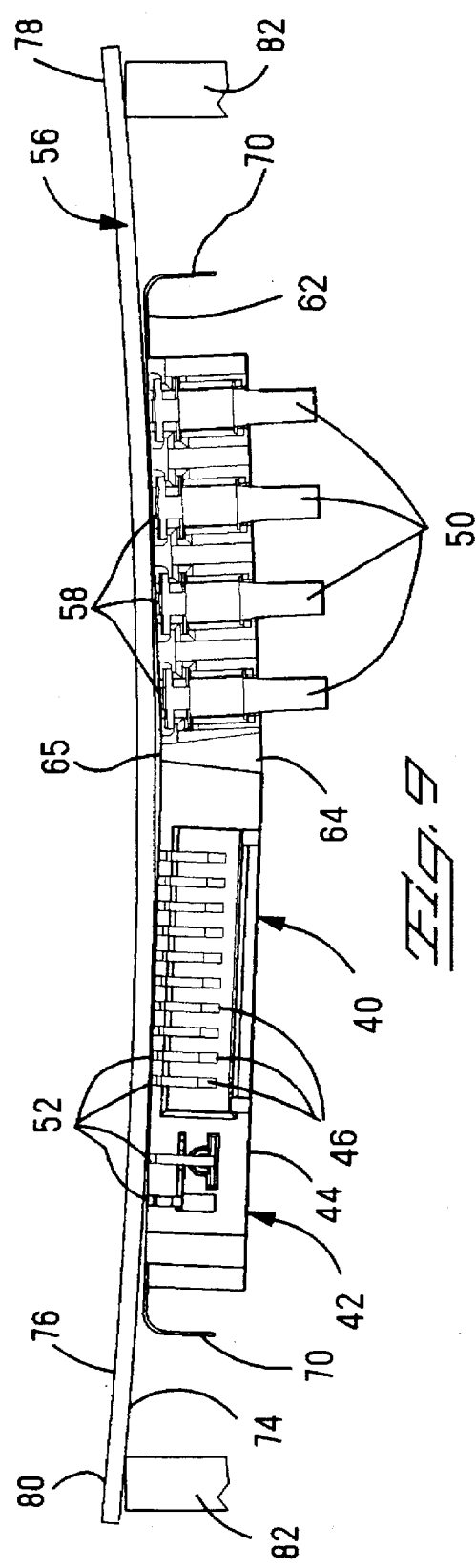

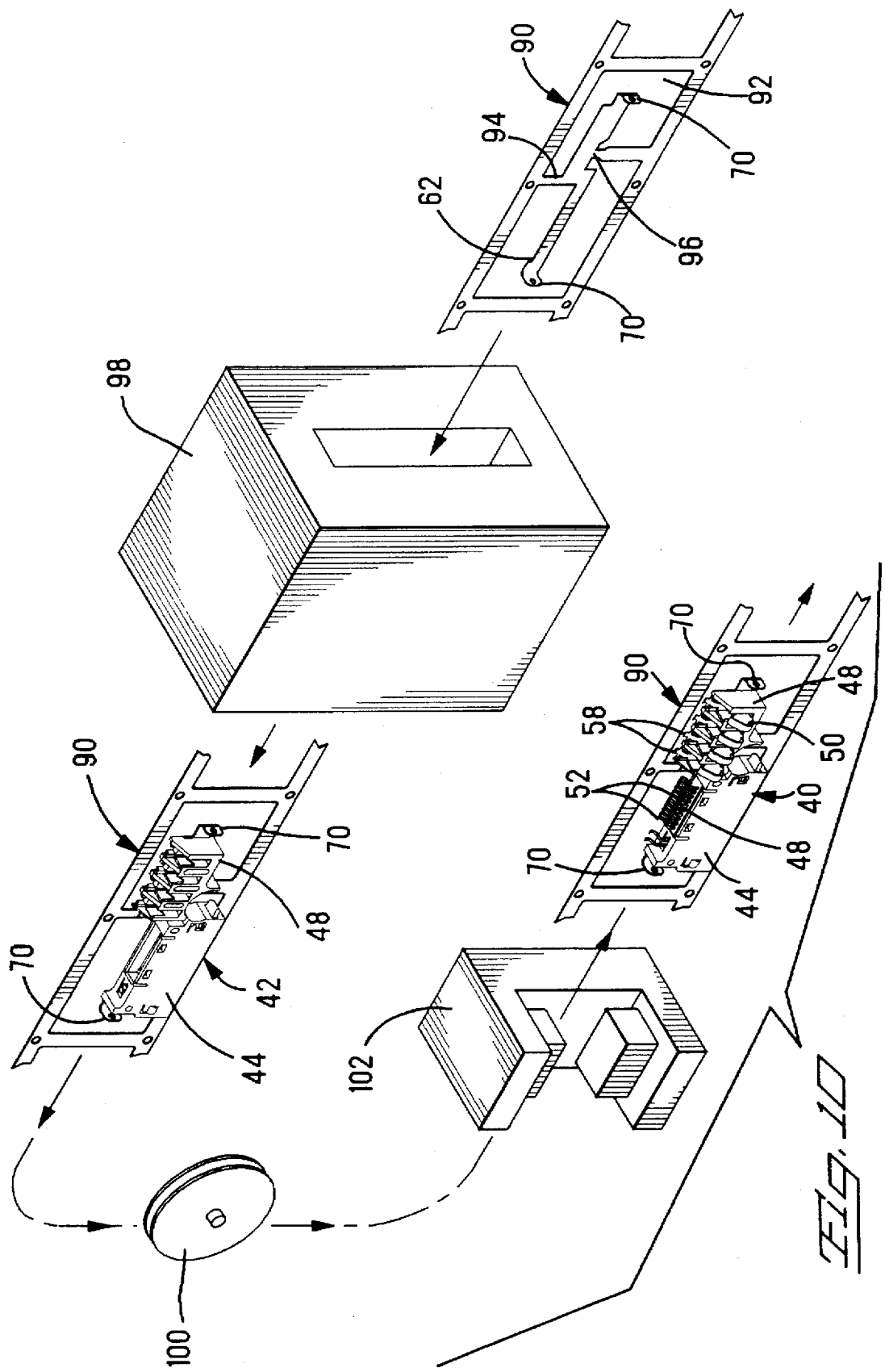

ELECTRICAL CONNECTOR HAVING A TWO PART ARTICULATED HOUSING

The present invention is related to electrical connectors of the type that are surface mounted to circuitry on relatively thin flexible circuit boards, and more particularly to such connectors that are capable of accommodating the curved mounting surfaces which may be associated with these boards.

BACKGROUND OF THE INVENTION

Electronic equipment, such as computers and cellular telephones, typically contain various circuit boards that in turn contain electronic components that are interconnected via metalized circuitry on the circuit boards. Electrical connectors are frequently used to interconnect a circuit board to other circuit boards or to other components of the equipment. With the continuing advance of electronic technology, the individual components of the electronic equipment are made smaller resulting in miniaturized but highly dense packages. Circuit board technology has similarly migrated toward smaller and thinner structures. When a connector is surface mounted to a circuit board, the contact leads of the connector must be brought into mated engagement with respective solder pads on the circuit board and held there during soldering. Typically, solder paste is applied to the solder pads on one side of the circuit board and a connector and electrical components placed in position with their leads embedded in the solder paste and in contact with the pads. The circuit board is placed in a fixture which is then placed in a furnace and subjected to heat to reflow the solder and complete the electrical connection between the leads of the connector and the circuitry. If the circuit board is double sided it is then turned over and the process repeated so that a connector and components are soldered to circuitry on both sides of the circuit board. By way of example, as shown schematically in FIG. 1, a circuit board 10 is supported at its edges 12 and 14 by a fixture 16. A prior art electrical connector 18, shown in plan view in FIG. 2, is in position on the top surface 28 of the circuit board, prior to soldering, and another similar connector 19 that had been previously soldered in place is on the lower surface 30. The connector 18, in the present example, includes an insulating housing 20, four leads 22 from power contacts and several leads 24 from signal contacts, contained within the housing. Three mounting clips 26 are arranged in openings in the housing so that they are flush with the bottom mounting surface of the housing. FIGS. 3 and 4 are enlarged views of a portion of the circuit board 10 shown in FIG. 1. As shown in FIG. 3, when the circuit board is quite thin it will sag downwardly a substantial amount while it is being supported by its edges. This results in the top surface 28, against which the connector 18 is resting, being concave. This concave condition of the circuit board may also be aggravated by distortions caused during the manufacture of the circuit board. When the connector 18 is moderately long the leads 22' and 24' and the clip 26 near the center of the connector may be sufficiently spaced from the surface 28 so that they will not be soldered to their respective solder pads during the soldering operation. Additionally, the connector 19 which was previously soldered to the surface 30 when the circuit board 10 was reversed, will now be on the lower side of the circuit board, as shown in FIG. 4. Since the circuit board 10 sags downwardly the lower surface 30 is convex. When the circuit board is again heated to reflow the solder paste on the upper surface 28 the solder on the lower surface 30 will melt causing the leads 22' and 24' and the clips 26 near the ends of the connector 19 to lift off of the surface 30. If the space between the leads and their solder pads is great enough the solder will separate, due to surface tension, and there will be no electrical connection upon completion of the soldering operation. Additionally, the reduced contact with the melted solder yields less holding force due to surface tension, therefore, the connector 19 may fall off of the circuit board while soldering the connector 18 in place. While the particular prior art connector 18, in the present example, has the above described problems, so too do other similar connectors that are rather long and intended for mounting to relatively thin flexible circuit boards that are supported at their edges during soldering.

What is needed is an electrical connector that will conform sufficiently to the curved surface of the circuit board so that the leads remain sufficiently close to their respective solder pads to assure a good soldered connection and, to provide sufficient area in contact with the melted solder to retain the connector in place on the under side of the circuit board when a connector is being soldered on the upper side.

SUMMARY OF THE INVENTION

An electrical connector is provided having a two part articulated housing for surface mounting to a curved mounting surface of a circuit board. A first housing part of insulating material is provided containing a plurality of first electrical contacts therein for mating with contacts in a mating connector. The first electrical contacts have leads extending out of the first housing part that are arranged to engage first solder pads on the mounting surface. A second housing part of insulating material is provided containing a plurality of second electrical contacts therein for mating with contacts in the mating connector. The second electrical contacts have leads extending out of the second housing part that are arranged to engage second solder pads on the mounting surface. A flexible coupling interconnects the first and second housing parts. The coupling is arranged so that when the connector is placed upon the curved mounting surface with solder paste therebetween, the first and second housing parts mutually deflect so that the leads of the first and second electrical contacts engage and are embedded in the solder paste.

DESCRIPTION OF THE FIGURES

FIG. 1 is a schematic view of a circuit board and two prior art connectors arranged on a solder fixture preparatory to soldering;

FIG. 2 is a front view of the prior art connector shown in FIG. 1;

FIGS. 3 and 4 are enlarged views of portions of the view of FIG. 1;

FIGS. 5, 6, and 7 are front, side, and rear views, respectively, of an electrical connector incorporating the teachings of the present invention, FIGS. 5 and 6 showing the connector on a circuit board;

FIGS. 8 and 9 are side views of the connector shown in FIG. 5, on a curved mounting surface of a circuit board;

FIG. 10 is a schematic view showing the process of making the connector shown in FIG. 5.

DESCRIPTION OF THE PREFERRED EMBODIMENT

Figure 11:
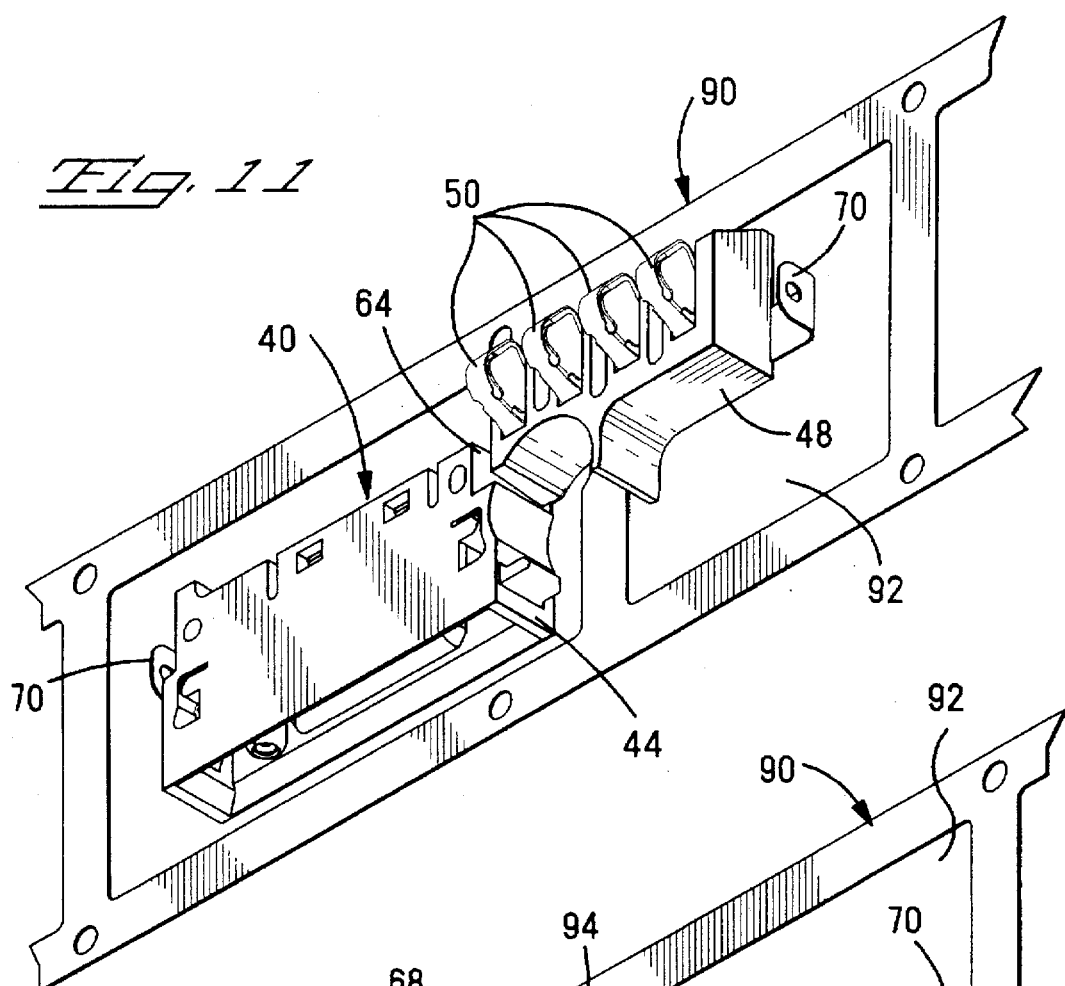
FIGS. 11 and 12 are isometric views of the front and rear, respectively, of the connector shown in FIG. 5.

There is shown in FIGS. 5, 6, and 7, an electrical connector 40 having a two part articulated housing 42. The two part housing 42 includes a first insulating housing part 44 containing a plurality of signal contacts 46 and a second insulating housing part 48 containing a plurality of power contacts 50. Each of the signal contacts has a lead 52 extending out of the housing part 44 and arranged to engage a solder pad 54 on a circuit board 56, as best seen in FIG. 5. Similarly, each of the power contacts 50 has a lead 58 extending out of the housing part 48 and arranged to engage a solder pad 60 on the circuit board 56. The two housing parts 44 and 48 are attached to a thin flexible metal strip 62 so that a space 64 remains between the two housing parts, as best seen in FIG. 5. The flexible strip 62 is a copper alloy having a width of about 0.125 inch and a thickness of about 0.005 inch. The portion 65 of the metal strip 62 that spans the space 64 will permit the two housing parts to mutually move in the direction perpendicular to the plane of the strip but not lateral thereto. The flexible strip 62 runs the entire length of the two housing parts 44 and 48 and has a back surface 63 that is flush with the bottom mounting surfaces 66 and 68 of the connector housing 42. There is a tab 70 at each end of the strip 62 bent at right angles thereto away from the mounting surfaces 66 and 68, for a purpose that will be explained. In practice, generally, the connector 40 is mounted to the circuit board 56 in a manner similar to that of the prior art connector 18. The solder pads 54, 60, and one or more solder pads 72 are coated with solder paste, not shown, and the connector 40 placed in position on the board so that the leads 52 and 58 are embedded in the solder paste and are in engagement with their respective solder pads 54 and 60. The circuit board 56 is then supported by its edges on a solder fixture similar to the fixture 16 and placed in a furnace to heat and reflow the solder paste in the usual manner. The bottom surface of the strip 62 is soldered to one or more solder pads 72 on the circuit board 56, and the leads 52 and 58 are soldered to their respective solder pads 54 and 60.

As shown in FIGS. 8 and 9, the circuit board 56 exhibits a sag downwardly because it is supported only by its edges 78 and 80 on a solder fixture 82. The strip 62 is sufficiently flexible at the portion 65 that it permits the two parts of the connector housing 42 to undergo relative movement in the space 64 to conform somewhat to the curvature of the surface 74 or 76 without one part moving laterally out of position with respect to the other part. This permits the two part housing 42 to align itself on the curved mounting surface as if it were two separate parts, yet maintain position with respect to the solder pads on the circuit board as if it were a single part. That is, the housing part 44 aligns itself to the curved surface independently of the housing part 48, and the housing part 48 similarly aligns itself to the curved surface, without adversely affecting the alignment of the leads with respect to their solder pads. This avoids the adverse effect of the rigid connector 18 by allowing all of the contact leads 52 and 58 to be relatively closer to their respective solder pads 54 and 60. Additionally, the flexible strip 62 is closer to its solder pads 72 for more of its length than in the prior art case. This has the added advantage of providing more contact area with the solder so that there is increased force via surface tension of the melted solder tending to hold the connector on the circuit board during the solder process. After soldering the first connector 40 to the surface 74 of the circuit board 56, as shown in FIG. 8, the board is inverted on the fixture, as shown in FIG. 9, more solder paste and a second connector 40, not shown, are placed in position of the surface 76 and the entire assembly is again heated in the furnace to solder the second connector to the surface 76. During this process the solder holding the first connector 40 is melted allowing the two housing parts of the first connector to conform to the now convex surface 74. Since the back surface 63 of the flexible strip 62 has a relatively large area, compared to the mounting chips 26 in the prior art connector 18, the surface tension of the melted solder in contact with the strip 62, as well as the leads 52 and 58, is sufficiently strong to hold the connector 40 in place on the surface 74, against the force of gravity, as viewed in FIG. 9. Since a substantial portion of the bottom surface of the flexible strip 62 is soldered to the pads 72, the connector 40 could be difficult to remove for replacement. Therefore, resistance heating of the strip 62 may be used to melt the solder to facilitate removing the connector 40 from the circuit board 56. The tabs 70 are utilized as terminals for attaching leads from a source of electrical current, not shown, for providing the power for the resistance heating.

Figure 12:
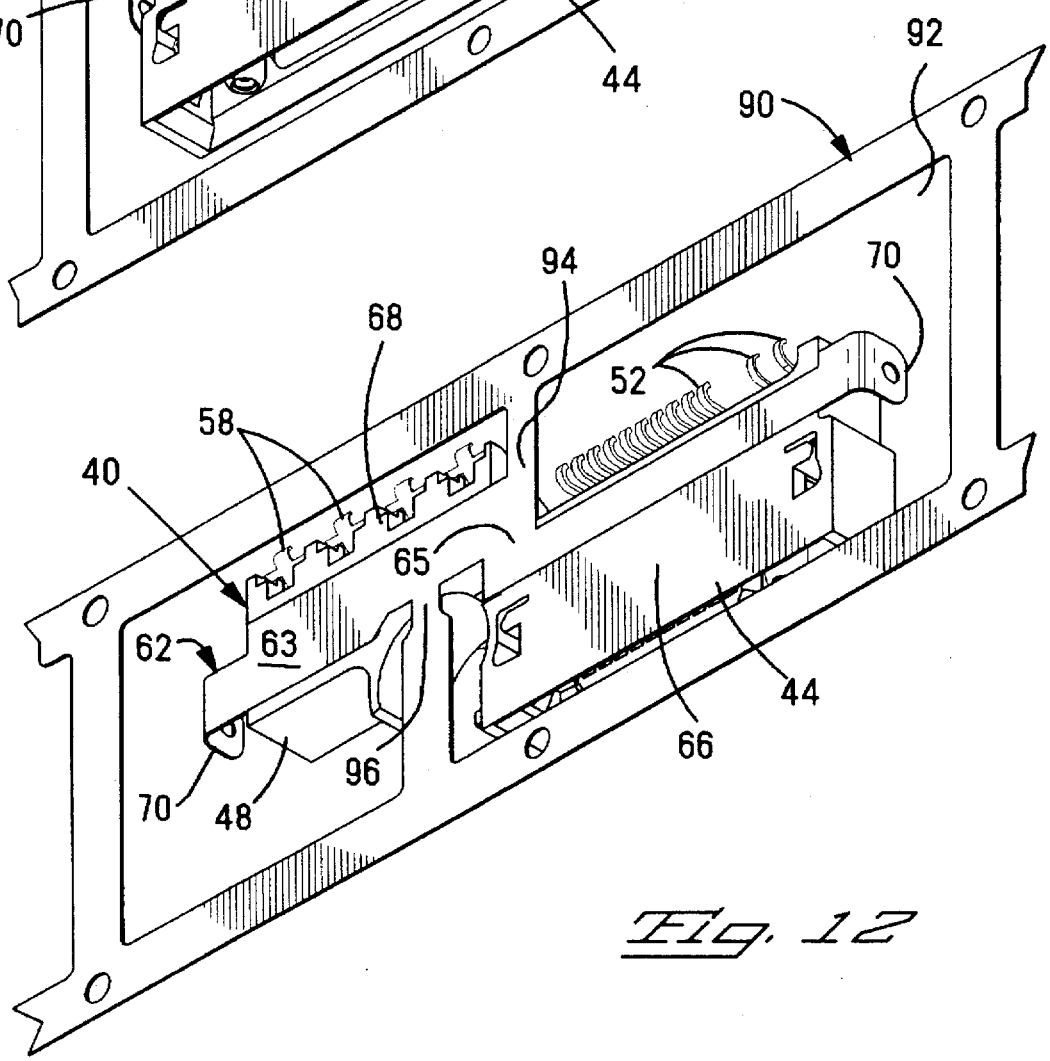

The process of manufacturing the connector 40 will now be discussed, with reference to FIGS. 10, 11, and 12. As shown in FIG. 10, a carrier strip 90 has a series of frame openings 92, each of which includes one flexible strip 62, the carrier strip and flexible strip having been formed on a stamping and forming machine in the usual manner. Each of the flexible strips 62 are attached to the carrier strip 90 at two points 94 and 96. The points 94 and 96 are chosen to be adjacent edges of the finished connector 40 that are accessible by tooling for severing the strip 62 from the carrier strip later. As shown schematically in FIG. 10, the carrier strip 90, which is a so called endless strip supplied on a reel, is feed into a plastic injection mold machine 98. The mold machine molds the two housing parts 44 and 48, insitu, onto the flexible strip 62. To enhance mechanical attachment of the two housing parts to the strip 62, tabs may be stamped and formed integral to the strip that extend into the molded housing parts. Note that the back surface 63, in the present example, is flush with the mounting surfaces 66 and 68 of the two housing parts, although it need not be. As the carrier strip 90 emerges from the mold machine 98, as shown in FIG. 10, the strip with the two housing parts 44 and 48 attached to each flexible strip 62, is wound onto a reel 100, for later processing. The carrier strip 90, along with the attached connector housings 42, is later dereeled from the reel 100 and fed into a contact insertion machine 102. Optionally, the carrier strip 90 may be feed directly into the contact insertion machine 102 from the mold machine 98, if desired. The contact insertion machine 102 inserts the signal contacts 46 into the first housing part 44 and the power contacts 50 into the second housing part 48. As the carrier strip 90 emerges from the contact insertion machine 102, the connector 40 is arranged on the carrier strip 90 as shown in FIGS. 11 and 12. The carrier strip 90, along with the completed connectors 40 may be wound onto a reel, not shown, for later use, or the individual connectors 40 may be separated from the carrier strip by severing at the points 94 and 96, shown in FIG. 12. In the case of separating the connector from the carrier strip, the individual connectors 40 may be packaged in trays or tubes for later use, or the connectors may be inserted into pockets on pocket tape, which is then wound onto a reel for later use. Alternatively, the carrier strip 90 emerging from the contact insertion machine 102 may be routed directly to a machine, not shown, for separating the connector from the carrier strip and immediately placing the connector on a circuit board for soldering thereto.

While, in the present example, the two housing parts 44 and 48 are coupled together by a flexible strip 62 with a space 64 between the two housing parts, other means of coupling will be considered within the teachings of the present invention, such as a projection on one of the parts and a mating receptacle on the other part that holds the two parts together and allows for the necessary relative movement of the parts, or by an elastomeric or other similar resilient member attached to the two housing parts that allows the desired movement. The major requirement of the coupling is that flexibility be provided in the direction perpendicular to the mounting surface of the circuit board and substantial rigidity be provided in the direction lateral thereto.

An important advantage of the present invention is that the two part housing can move to conform somewhat to the curvature or irregularity of the mounting surface of the circuit board, thereby assuring that the contact leads of the connector are close to their respective solder pads during soldering. Another important advantage is that when soldering a connector on the upper side of the circuit board, a connector previously soldered to the other side of the board will be held in place by the increased surface tension due to the flexible strip offering more surface area in contact with the melted solder.

We claim:

1. A surface mountable electrical connector having a two part articulated housing comprising:

(a) a first housing part of insulating material containing a plurality of first electrical contacts therein for mating with contacts in a mating connector, said first electrical contacts having leads extending out of said first housing part and arranged to engage first solder pads on a curved mounting surface;

(b) a second housing part of insulating material containing a plurality of second electrical contacts therein for mating with contacts in said mating connector, said second electrical contacts having leads extending out of said second housing part and arranged to engage second solder pads on said curved mounting surface; and (c) a flexible metal coupling strip interconnecting said first and second housing parts, having electrical terminals on opposite ends thereof and being arranged so that when said connector is placed upon said curved mounting surface with solder paste between said connector and in engagement with said curved mounting surface, said first and second housing parts mutually deflect so that said leads of said first and second electrical contacts engage and are embedded in said solder paste.

2. The connector according to claim 1 wherein said flexible coupling includes a flexible member, one end of which is attached to said first housing part and the other end of which is attached to said second housing part.

3. The connector according to claim 1 wherein said metal coupling strip is substantially flush with a first mounting surface of said first housing part and with a second mounting surface of said second housing part so that when said connector is placed upon said curved mounting surface, a portion of said strip between said first and second housing parts deflects so that said strip somewhat conforms to said curved mounting surface.

4. The connector according to claim 3 wherein said first and second housing parts are molded insitu onto said metal coupling strip.

5. The connector according to claim 3 wherein said metal coupling strip contains a substantially flat first surface including said portion, said first surface having sufficient area so that when said connector is in position on said curved mounting surface with melted solder between said first surface and said mounting surface, surface tension of said melted solder will hold said connector on said mounting surface.

6. The connector according to claim 5 wherein said metal strip is an electrical resistance heater.

7. The connector according to claim 1 wherein said flexible metal coupling is arranged so that when said connector is placed upon said curved mounting surface, said flexible metal coupling will deflect to conform to the shape of the curved mounting surface.

\* \* \* \* \*